United States Patent
Roy et al.

(10) Patent No.: US 7,379,381 B1
(45) Date of Patent: May 27, 2008

(54) STATE MAINTENANCE PULSING FOR A MEMORY DEVICE

(75) Inventors: Richard Roy, Danville, CA (US); Farid Nemati, Redwood City, CA (US)

(73) Assignee: T-Ram Semiconductor, Inc., Milpitas, CA (US)

( * ) Notice: Subject to any disclaimer, the term of this patent is extended or adjusted under 35 U.S.C. 154(b) by 227 days.

(21) Appl. No.: 11/175,057

(22) Filed: Jul. 5, 2005

(51) Int. Cl.
*G11C 8/00* (2006.01)
(52) U.S. Cl. .................. 365/233; 365/200
(58) Field of Classification Search ............. 365/222, 365/233, 200, 239, 225.7, 194
See application file for complete search history.

(56) References Cited

U.S. PATENT DOCUMENTS

| | | | |
|---|---|---|---|
| 5,539,349 A * | 7/1996 | Roy | ............. 327/276 |
| 5,644,545 A | 7/1997 | Fisch | |
| 5,761,703 A | 6/1998 | Bolyn | |
| 6,166,980 A | 12/2000 | Chun | |
| 6,282,131 B1 * | 8/2001 | Roy | ............. 365/191 |
| 6,334,167 B1 | 12/2001 | Gerchman | |
| 6,462,359 B1 | 10/2002 | Nemati et al. | |
| 6,563,756 B2 | 5/2003 | Kim | |
| 6,570,802 B2 | 5/2003 | Ohtsuka | |
| 6,583,452 B1 | 6/2003 | Cho et al. | |
| 6,611,452 B1 | 8/2003 | Han | |
| 6,653,174 B1 | 11/2003 | Cho et al. | |
| 6,653,175 B1 | 11/2003 | Nemati et al. | |
| 6,666,481 B1 | 12/2003 | Horch et al. | |
| 6,683,330 B1 | 1/2004 | Horch et al. | |
| 6,686,612 B1 | 2/2004 | Horch et al. | |
| 6,690,038 B1 | 2/2004 | Cho et al. | |
| 6,690,039 B1 | 2/2004 | Nemati et al. | |
| 6,703,646 B1 | 3/2004 | Nemati et al. | |
| 6,721,220 B2 | 4/2004 | Yoon et al. | |

(Continued)

FOREIGN PATENT DOCUMENTS

WO  WO 02/082504 A2  10/2002

OTHER PUBLICATIONS

Nemati, F. et al., Fully Planar 0.562um2 T-RAM Cell in a 130 nm SOI CMOS logic technology for high-density high-performance SRAMs. IEDM Technical Digest, 2004, IEEE.

*Primary Examiner*—Anh Phung
*Assistant Examiner*—Hien Nguyen
(74) *Attorney, Agent, or Firm*—The Webostad Firm

(57) ABSTRACT

State maintenance of a memory cell and, more particularly, state maintenance pulsing of identified memory cells more frequently than other memory cells, is described. A memory array includes an array of memory cells. State maintenance circuitry is coupled to the array of memory cells. The state maintenance circuitry is configured to select between a first restore address and a second restore address. In a given operation cycle, the first restore address is associated with a first line in the array of memory cells, and the second restore address is associated with a second line in the array of memory cells. The first line has first memory cells coupled thereto. The second line has second memory cells coupled thereto. The first memory cells are capable of passing a threshold retention time with a first frequency of restore cycling. The second memory cells are capable of passing the threshold retention time with a second frequency of restore cycling. The second frequency of restore cycling is greater than the first frequency of restore cycling.

29 Claims, 8 Drawing Sheets

U.S. PATENT DOCUMENTS

| | | |
|---|---|---|
| 6,727,528 B1 | 4/2004 | Robins et al. |
| 6,728,156 B2 | 4/2004 | Kilmer |
| 6,734,815 B1 | 5/2004 | Abdollahi-Alibeik et al. |
| 6,735,113 B2 | 5/2004 | Yoon et al. |
| 6,756,612 B1 | 6/2004 | Nemati et al. |
| 6,756,838 B1 | 6/2004 | Wu et al. |
| 6,767,770 B1 | 7/2004 | Horch et al. |
| 6,777,271 B1 | 8/2004 | Robins et al. |
| 6,778,435 B1 | 8/2004 | Han et al. |
| 6,781,888 B1 | 8/2004 | Horch et al. |
| 6,785,169 B1 | 8/2004 | Nemati et al. |
| 6,790,713 B1 | 9/2004 | Horch |
| 6,804,162 B1 | 10/2004 | Eldridge et al. |
| 6,815,734 B1 | 11/2004 | Horch et al. |
| 6,818,482 B1 | 11/2004 | Horch et al. |
| 6,819,278 B1 | 11/2004 | Abdollahi-Alibeik et al. |
| 6,828,176 B1 | 12/2004 | Nemati et al. |
| 6,828,202 B1 | 12/2004 | Horch |
| 6,835,997 B1 | 12/2004 | Horch et al. |
| 6,845,037 B1 | 1/2005 | Han |
| 6,872,602 B1 | 3/2005 | Nemati et al. |
| 6,885,581 B2 * | 4/2005 | Nemati et al. ............... 365/159 |
| 6,888,176 B1 | 5/2005 | Horch et al. |
| 6,888,177 B1 | 5/2005 | Nemati et al. |
| 6,891,205 B1 | 5/2005 | Cho et al. |
| 6,891,774 B1 | 5/2005 | Abdollahi-Alibeik et al. |
| 6,901,021 B1 | 5/2005 | Horch et al. |
| 6,903,987 B2 | 6/2005 | Yoon et al. |
| 6,911,680 B1 | 6/2005 | Horch et al. |
| 6,913,955 B1 | 7/2005 | Horch et al. |
| 6,937,085 B1 | 8/2005 | Samaddar |
| 6,940,772 B1 | 9/2005 | Horch et al. |
| 6,944,051 B1 | 9/2005 | Lee et al. |
| 6,947,349 B1 * | 9/2005 | Abdollahi-Alibeik et al. ... 365/233 |
| 6,953,953 B1 | 10/2005 | Horch |
| 6,958,931 B1 | 10/2005 | Yoon et al. |
| 6,965,129 B1 | 11/2005 | Horch et al. |
| 6,975,260 B1 | 12/2005 | Abdollahi-Alibeik et al. |
| 6,979,602 B1 | 12/2005 | Horch et al. |
| 6,980,457 B1 | 12/2005 | Horch et al. |
| 6,998,298 B1 | 2/2006 | Horch |
| 6,998,652 B1 | 2/2006 | Horch et al. |
| 7,006,398 B1 | 2/2006 | Yoon et al. |
| 7,187,607 B2 | 3/2007 | Koshikawa |

* cited by examiner

STATE MAINTENANCE PULSING FOR A MEMORY DEVICE

FIELD OF THE INVENTION

One or more aspects of the invention generally relate to state maintenance of a memory cell and, more particularly, to state maintenance pulsing of identified memory cells more frequently than other memory cells.

BACKGROUND OF THE INVENTION

Conventionally, dynamic memories, such as dynamic random access memories ("DRAMs") require a periodic refresh. For DRAMs, this conventionally means a destructive read is done, followed by a write back of the information read. Furthermore, some memory cells in an array of memory cells of a DRAM may need to be refreshed more often than other memory cells. This is generally due to some memory cells being more susceptible to charge leakage at various operating parameters.

To increase yield of DRAMs, as well as to affect overall refresh rate, it has been proposed by others to identify memory cells needing to be refreshed more often than other memory cells. These so-called weaker memory cells could then be refreshed more often than their counterpart stronger memory cells. Additional details regarding this proposed refresh approach may be found in U.S. Pat. No. 5,644,545 B1.

For a new type of memory cell known as a thyristor-based memory cell, no refreshing is used. In other words, there is no destructive read followed by a write back to refresh a memory cell back to its original state. Rather than refreshing, a thyristor-based memory cell is periodically pulsed. This pulsing is done at a frequency such that the thyristor-based memory cell maintains its current state. Additional details regarding periodically pulsing a thyristor-based memory cell may be found in Patent Cooperation Treaty ("PCT") International Publication WO 02/082504.

Like DRAM cells, some thyristor-based memory cells may be more susceptible to charge leakage at various operating parameters due to defects or statistical variations of process parameters. Accordingly, it would be desirable and useful to provide means to maintain state of such thyristor-based memory cells more susceptible to charge leakage than other such thyristor-based memory cells of the same memory integrated circuit without spending the additional power to pulse all memory cells in an array at a frequency associated with those cells more susceptible to charge leakage, namely a "higher frequency."

SUMMARY OF THE INVENTION

One or more aspects of the invention generally relate to state maintenance of a memory cell and, more particularly, to state maintenance pulsing of identified memory cells more frequently than other memory cells.

An aspect of the invention is an integrated circuit having memory. The memory array includes an array of memory cells. State maintenance circuitry is coupled to the array of memory cells. The state maintenance circuitry is configured to select between a first restore address and a second restore address. The first restore address is associated with a first line in the array of memory cells. The second restore address is associated with a second line in the array of memory cells. The first line has first memory cells coupled thereto. The second line has second memory cells coupled thereto. The first memory cells are capable of passing a threshold retention time with a first frequency of restore cycling. The second memory cells are capable of passing the threshold retention time with a second frequency of restore cycling. The second frequency of restore cycling is greater than the first frequency of restore cycling.

Another aspect of the invention is a method for maintaining state of stored data. A clock signal is provided. A selective restore mode is selectively activated. At least one selective restore address for the selective restore mode is provided and selected as a first wordline restore address for a first wordline in an array of memory cells. A restore pulse is applied to each memory cell associated with the first wordline responsive to the clock signal. The selective restore mode for a global restore mode is selectively deactivated.

Yet another aspect of the invention is an integrated circuit having memory, including: a memory array including an array of memory cells; and state maintenance circuitry coupled to the array of memory cells, where the state maintenance circuitry is configured to select between a selective address and a global address. The selective address is associated with at least one memory cell in the array of memory cells to be pulsed greater than a threshold amount, and the global address is associated with at least one other memory cell in the array of memory cells to be pulsed the threshold amount. The at least one memory cell and the at least one other memory cell are each configured such that pulsing with a short duration pulse maintains data state respectively thereof by application of a state maintenance pulse to at least one access wordline associated with the at least one memory cell and the at least one access wordline or another at least one access wordline associated with the at least one other memory cell.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well-known features have not been described in detail so as not to obscure the invention. For ease of illustration, the same number labels are used in different diagrams to refer to the same items, however, in alternative embodiments the items may be different. Moreover, for purposes of clarity, a single signal or multiple signals may be referred to or illustratively shown as a signal to avoid encumbering the description with multiple signal lines. Moreover, along those same lines, a multiplexer or a register, among other circuit elements, may be referred to or illustratively shown as a single multiplexer or a single register though such reference or illustration may be representing multiples thereof. Furthermore, though particular signal bit widths, data rates, and frequencies are described herein for purposes of clarity by way of example, it should be understood that the scope of the description is not limited to these particular numerical examples as other values may be used.

Figure 1A:
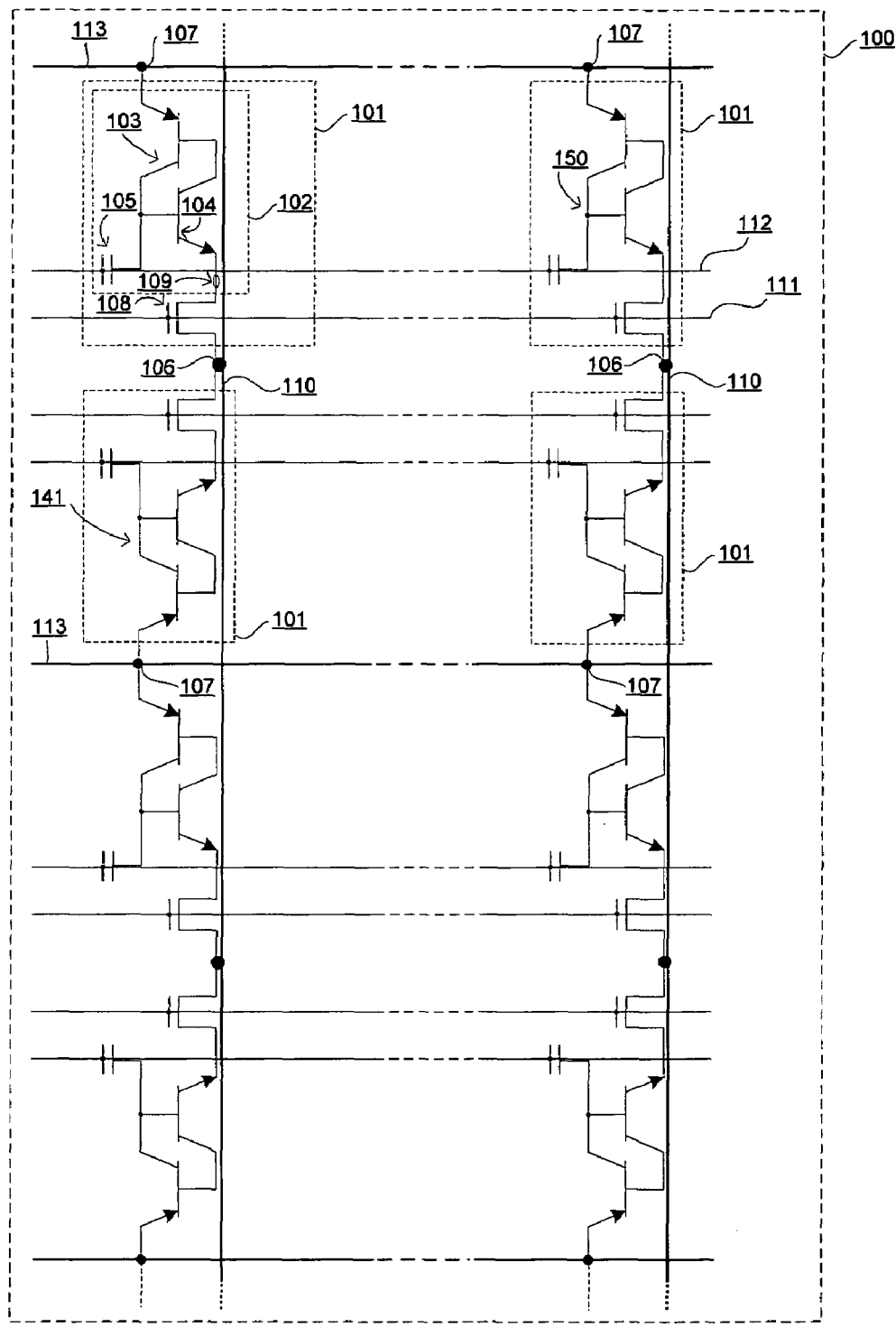
FIG. 1A is a schematic diagram depicting an exemplary embodiment of a memory array that includes thyristor-based memory cells.

FIG. 1A is a schematic diagram depicting an exemplary embodiment of a memory array 100. Memory array 100 includes thyristor-based memory cells 101. Pairs of memory cells 101 may be commonly coupled at a bitline contact 106 for connection to a bitline 110 and may be commonly coupled at a supply voltage contact 107 for connection to a supply voltage line 113. Notably, voltage on supply voltage line 113 is above both a logic low voltage reference level ("Vss") and a logic high voltage reference level ("Vdd"), and this supply voltage may be used as an anodic voltage for memory cell 101. Accordingly, reference to this supply voltage includes its anodic use, and as such it is referred to herein as "VDDA" to clearly distinguish it from Vdd. Thus, supply voltage line 113 is subsequently referred to herein as anode voltage line 113, and supply voltage contact 107 is subsequent referred to herein as anode contact 107.

Each memory cell 101 includes an access device ("transistor") 108; which may be a field effect transistor ("FET"), and a thyristor-based storage element 102. Notably, access device 108 need not be a transistor; however, for purposes of clarity by way of example access device 108 shall be referred to herein as transistor 108. Storage element 102 and transistor 108 may be commonly coupled at a node 109. Node 109 may be a cathodic node of storage element 102 and a source/drain node of transistor 108, and thus may be referred to hereafter as cathode node 109.

Illustratively shown in FIG. 1A is an equivalent circuit model of storage element 102 having cross coupled bi-polar junction transistors ("BJTs") 103 and 104, as well as capacitor 105. Storage element 102 may be a type of a device known as Thin Capacity Coupled Thyristor ("TCCT") device. Again, in this example, storage element 102 is coupled in series with an n-MOS transistor 108 to provide memory cell 101. However, a p-MOS architecture may be used.

For each memory cell 101, a gate of access transistor 108 is formed from a wordline ("WL1") 111 in relation to an active area, as generally indicated in FIG. 1A by small dots coupling gates of access transistors 108 to WL1s 111. A control gate of storage element 102, generally indicated as a plate of capacitor 105, is formed with another wordline ("WL2") 112, as generally indicated by small dots coupling plates of capacitor 105 to WL2s 112. Though only a few rows of memory cells 101 are illustratively shown in FIG. 1A, it should be appreciated that many more rows may be used. The exact number of memory cells or bits associated with a WL1 111 or a WL2 112 may vary from application to application. However, for purposes of clarity by way of example and not limitation, it shall be assumed that there are 144 memory cells coupled to each WL1 111 and 18 memory cells coupled to each WL2 112, though other numbers for either or both may be used.

An emitter node of BJT 103 is coupled to anode voltage line 113 by anode contact 107. A base of BJT 103 is coupled a collector of BJT 104. An emitter of BJT 104 is coupled to cathode node 109. A base of BJT 104 and a collector of BJT 103 are commonly coupled to a bottom plate of capacitor 105, and this common coupling location may be generally referred to as storage node 150.

Figure 1B:
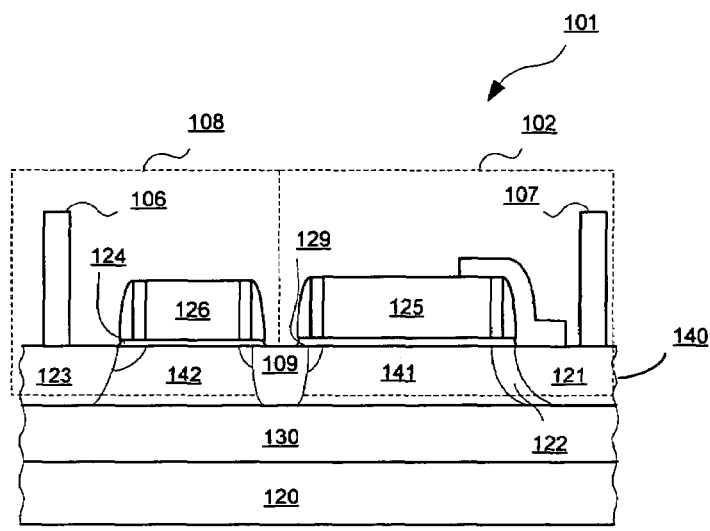
FIG. 1B is a cross-sectional view depicting an exemplary embodiment of a device structure for a memory cell of the memory array of FIG. 1A.

FIG. 1B is a cross-sectional view depicting an exemplary embodiment of a device structure for a memory cell 101 of FIG. 1A. In this embodiment, memory cell 101 is formed using a silicon-on-insulator ("SOI") wafer having a substrate layer 120 on which a buried oxide ("BOx") layer 130 is formed. Formed on BOx layer 130 is an active silicon layer 140. Though an SOI wafer is generally illustrated in FIG. 1B, other known types of semiconductor wafers may be used.

In active silicon layer 140, anode region 121, base region 122, base region 141, cathode region 109, and bitline access region 123 are formed. Base region 141 is located between base region 122 and cathode region 109 of storage element 102. Between cathode node 109 and access region 123 is access device body region 142. In an embodiment, regions 121, 141, and 142 may be p-type regions, and regions 109, 122, and 123 may be n-type regions. Above regions 141 and 142 may respectively be formed one or more dielectric layers 124 and 129. Above one or more dielectric layers 124 and 129 may respectively be formed wordlines 111 and 112 of FIG. 1A, which in association with regions 141 and 142 are defined gates 125 and 126, respectively. Notably one or more dielectric layers 124 and 129 may be the same or different sets of layers, and such gate dielectric as associated with gate 126 and one or more dielectric layers 124 may be thinner than such gate dielectric associated with gate 125 and dielectric layers 129. Gate 126 is a gate of transistor 108 and an access gate of memory cell 101, and gate 125 is a control gate of storage element 102 and a write gate of memory cell 101. An anode contact 107 is coupled to anode region 121, and a bitline contact 106 is coupled to access region 123. Notably, access region 123 and cathode node 109 also serve as source/drain regions of transistor 108. Other details regarding memory cell 101, including silicides, extension regions, and spacers, among other known details, may be found in U.S. Pat. Nos. 6,767,770 B1 and 6,690,039 B1.

Figure 2:
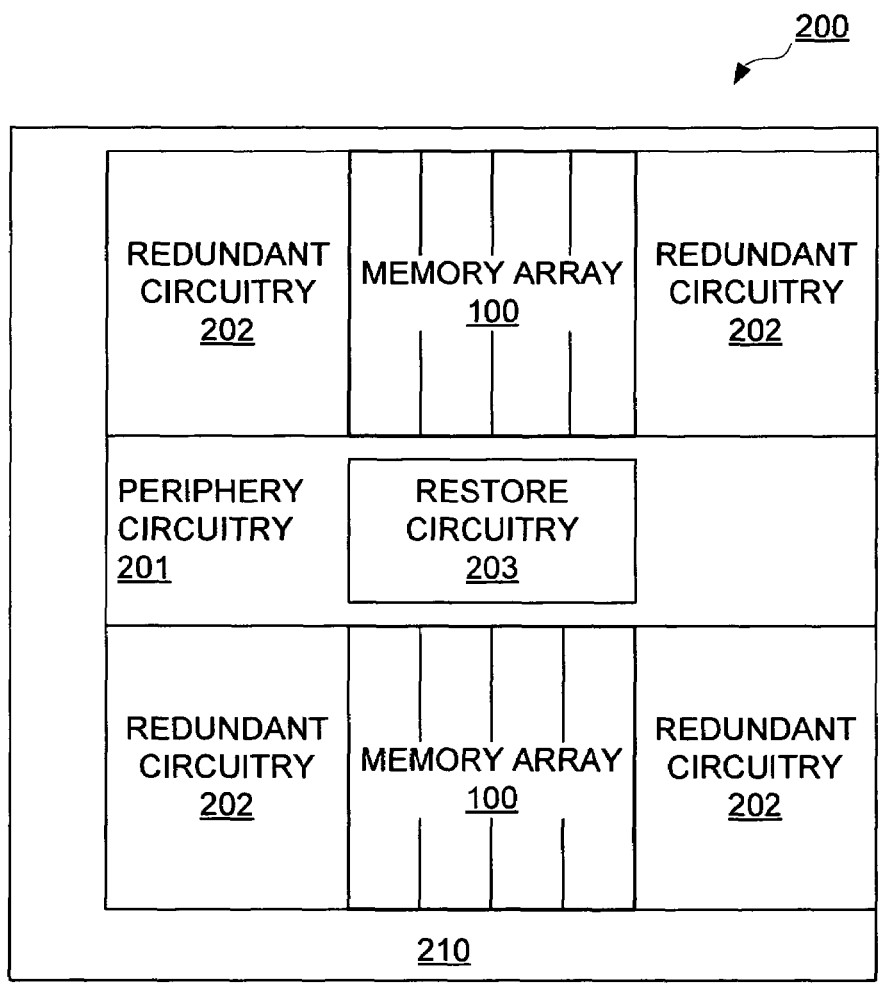
FIG. 2 is a high-level block diagram depicting an exemplary embodiment of a ihyristor-based memory.

FIG. 2 is a high-level block diagram depicting an exemplary embodiment of a thyristor-based memory 200. Memory 200 includes input/output ring 210, memory arrays 100, redundant circuitry blocks 202, periphery circuitry 201. Periphery circuitry 201 may include restore circuitry 203. In this exemplary embodiment, two redundant circuitry blocks 202 are illustratively shown for each memory array 100, though only one such block may be used for each memory array 100.

With continuing reference to FIG. 2, and renewed reference to FIG. 1A, memory 200 is further described. As is known, some of memory cells 101 of a memory array 100 may not store charge as long as other memory cells 101 of memory array 100. Furthermore, as is known, some of memory cells 101 of a memory array 100 may be more likely to have charge leak into them than other memory cells of memory array 100. Accordingly, each memory cell 101 may have a minimum threshold time for which it stores a logic level 1 and may have a minimum threshold time for which it stores a logic level 0. Certain memory cells 101 which are more susceptible to charge leakage than other memory cells 101 of memory array 100 may be identified using known testing methodologies. Furthermore, memory cells 101 of memory array 100 which are more susceptible to charge leakage into such cells may be identified by known testing methodologies. Accordingly, an address of each "less stable" cell, namely each cell more susceptible to leakage on or off or both, may be identified and mapped into restore circuitry 203. Notably, some of these weak cells may be on a same WL1 111 or WL2 112.

Restore circuitry 203 may include non-volatile programmable memory, fuses, anti-fuses, or other known non-volatile programmable elements, which may be used for programming in one or more addresses of defective memory cells 101 of memory array 100. Thus, these addresses could be registered as part of a power-up sequence for memory 200. In this manner, yield of memory 200 may be increased, as it may be sufficient to "restore" such less stable memory cells more frequently than their counterpart more stable memory cells of memory array 100. Notably, the term "restore" is used herein to refer to pulsing a memory cell to bring its level of charge up or down, depending on store state, to a more acceptable level without having to perform a read or write operation on such memory cell. Notably, restore pulsing is done prior to a memory cell reaching a change of state, and thus restore should not be interpreted as though state of a memory cell has changed. Moreover, such restore pulsing may be done prior to a memory cell reaching a metastable state.

Figure 3:
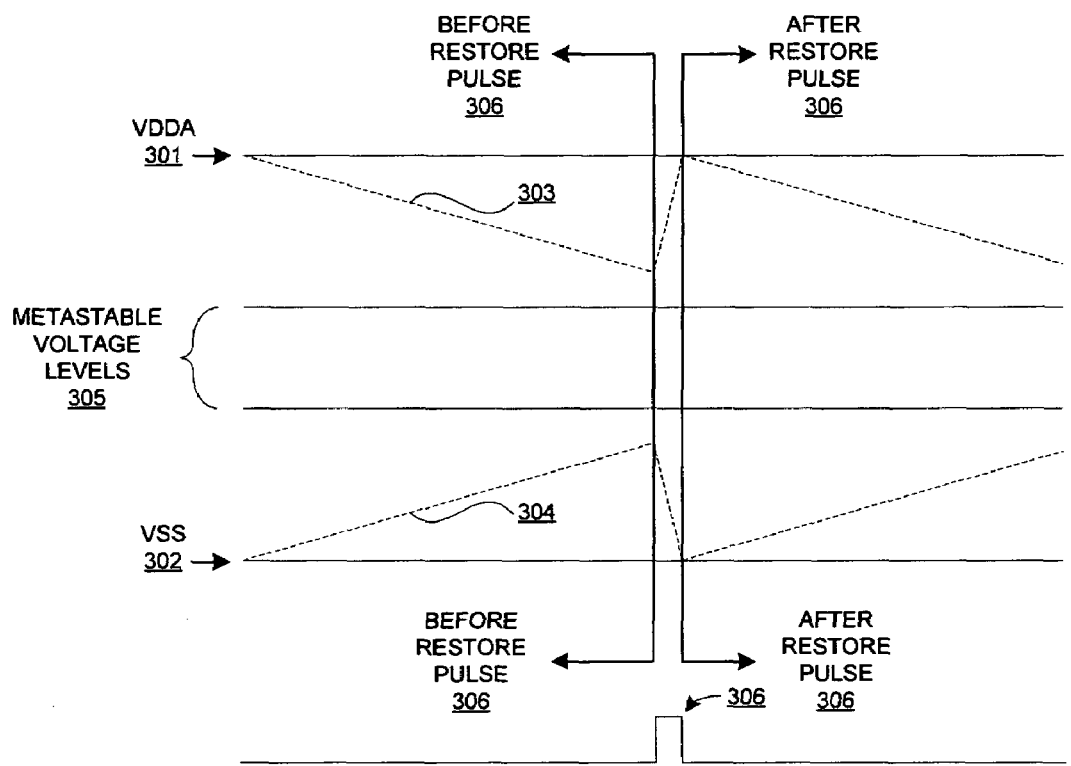
FIG. 3 is a graphical diagram depicting an exemplary embodiment of charge leakage and charge restoration in both positive and negative directions.

FIG. 3 is a graphical diagram depicting an exemplary embodiment of charge leakage and charge restoration in both positive and negative directions. With simultaneous reference to FIGS. 1A, 1B, and 3, the diagram of FIG. 3 is further described. For example, suppose the logic high level is VDDA 301 as associated with stored charge for storing a logic 1, and suppose the logic low level is Vss 302 as associated with stored charge for a logic 0. Thus, dashed line 303 indicates charge leakage from a memory cell 101, and dashed line 304 indicates charge leakage into a memory cell 101. Voltage levels associated with dashed lines 303 and 304 may not be allowed to reach metastable voltage levels 305 to prevent a memory cell 101 from becoming unstable. In order to restore a memory cell 101, a short duration pulse 306 is applied to WL1 111 of FIG. 1A.

Accordingly, a restoring pulse to WL1 111 with bitline 110 held at ground is applied prior to reaching metastable voltage levels 305 from either a positive or a negative direction such that a memory cell 101 has its charge appropriately restored. Thus, voltage levels associated with levels 303 and 304 before application of restore pulse 306 are heading toward metastable voltage levels 305, and after application of restore pulse 306 such voltage levels are being drawn back to VDDA 301 and Vss 302, respectively.

Thus, a logic 0 stored in a memory cell 101 is restored by a pull down operation. In other words, a logic 0 stored in a memory cell 101 is made more stable by application of a short duration pulse to gate access transistor 108 to temporarily couple p-base 141 to a logic low voltage level, such as ground, via bitline 110. This helps maintain such a memory cell 101 in generally a current blocking state by pulling p-base 141 to ground for example. Like restoration of a logic 0 voltage level, a short duration pulse is applied to gate access transistor 108 to temporarily couple storage element 102 to ground via bitline 110. However, in contrast to restoration of a logic 0 voltage level, because a memory cell 101 storing a logic 1 is generally in a current conducting state, storage element 102 progressively returns to a more stable conductive state responsive to this coupling of p-base 141 to ground for example. In this type of restore, p-base 141 may be brought at or near to a VDDA level.

Figure 4:
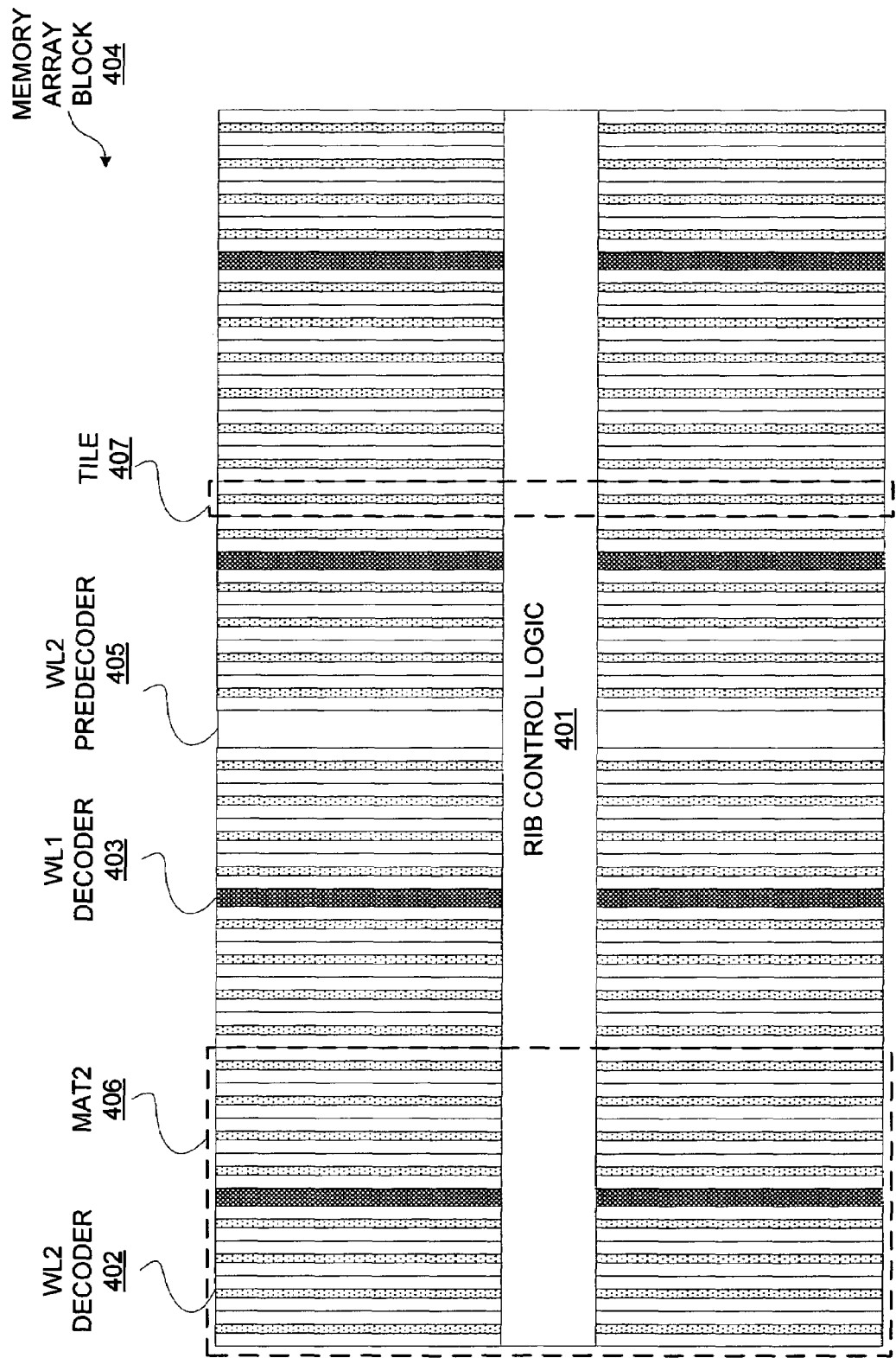
FIG. 4 is high-level block diagram depicting an exemplary embodiment of a portion of the memory array of FIG. 1A.

FIG. 4 is a high-level block diagram depicting an exemplary embodiment of a memory array block 404 such as of memory 100 of FIG. 2. A portion of a memory array known as a "rib" may include two memory array blocks 404 in succession. Memory array block 404 includes eight MATs, or four MAT2s 406. Each MAT2 406 includes eight tiles 407. Separating two MAT2s 406 on each side of block 404 is a WL2 predecoder 405. Horizontally extending across memory array block 404 is rib control logic 401. It should be understood that each tile 407 includes a WL2 decoder 402. Moreover, it should be understood that each MAT2 includes a WL1 decoder 403. For purposes of clarity by way of example and not limitation it shall be assumed that a rib is 2304 bits wide by 256 bits deep, which is divided into 16 MATs. Thus, with renewed reference to FIG. 1A, each WL1 111 is coupled to 2304/16 or 144 memory cells or bits, and there are 256 rows of WL1s 111.

Figure 5:
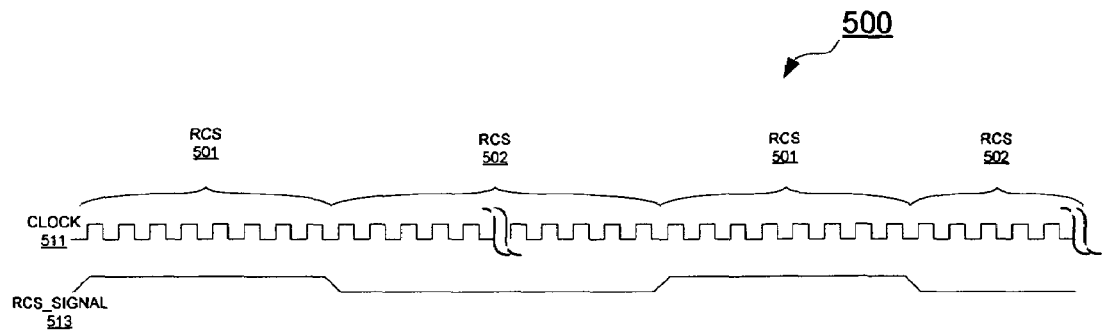
FIG. 5 is a high-level block diagram depicting an exemplary embodiment of a restore pulse cycling.

FIG. 5 is a signal diagram depicting an exemplary embodiment of a restore pulse cycling 500. Restore cycles ("RCS") 501 for less stable memory cells 101 are followed by restore cycles 502 for memory cells with acceptable stability. RCS 501 and 502 may be based upon cycles of a clock signal 511, where an RCS signal 513 is toggled from a logic low to logic high level to be in either a mode for RCS 501 or 502. Thus, memory cells 101 that do not have acceptable stability, but for additional restore pulsing, are restored repeatedly during each set of restore cycles 501, and memory cells 101 having acceptable stability, as well as those memory cells not having acceptable stability, are restored during restore cycles 502. Thus, continuing the above numerical example, a counter may count from 0 to 255 for each group of 256 WL1s 111 to provide 256 restore cycles or pulses 502, namely one for each WL1 111 of the group of 256. However, the number of restore cycles 501 may depend on the number of WL1s 111 within a grouping having at least one less stable memory cell. Notably, a counter counting for example from 0 to 255, may be paused for restore cycles 501, and then restarted after completion of restore cycles 501. So, for example, the counting for normal restore cycles for the above example would be from 0 to 255 followed by pause for restore cycles 501, and then the counting would begin again at 256 to 511 after the restore cycles 501. Notably, the same addresses for selective restore cycles 501 are repeatedly used during each set of restore cycles 501. This would continue until each WL1 111 is pulsed. For the above example, the counter would roll over after 2303.

Continuing the above example of 16 MATs to a row, a numerical value associated therewith termed "numMAT" may be used to set either all 16 MATS of a rib or just a portion thereof to be addressed within a restore cycle. Thus, for example, numMAT may be set equal to values of 1, 2, 4, 8, and 16.

Figure 6:
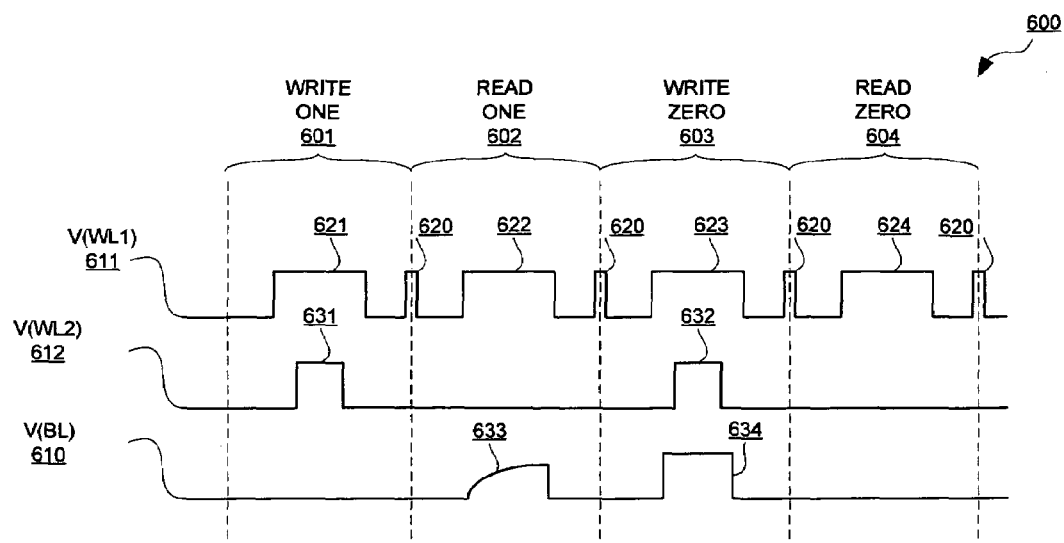
FIG. 6 is a high-level signal diagram depicting an exemplary embodiment of a read/write signal timing with restore pulsing.

FIG. 6 is a high-level signal diagram depicting an exemplary embodiment of read/write signal timing 600 with restore pulsing. To write a logic 1, namely write one operation 601, WL1 voltage 611 is brought to a logic high level as generally indicate by pulse 621 and WL2 voltage 612 is brought to a logic high level as generally indicated by pulse 631. Notably, for a write one operation 601, bitline voltage 610 is held at a logic low level. After WL1 voltage 611 is de-asserted, a restore pulse 620 may be applied to WL1 111 with this WL1 having just been used to complete a write one operation 601 or another WL1 located anywhere in the array, including on the same bitline. Immediately following such a write one operation 601 and such read/write cycle interstitial restore pulse 620, WL1 voltage 611 may be brought to a logic level high again as generally indicated by pulse 622 for a read one operation 602, namely to read the logic 1 previously written to a memory cell 101 associated with WL1 voltage 611 being asserted. Waveform 633 of bitline voltage 610 generally indicates that a logic 1 was read from the memory cell 101 accessed. Between read one operation 602 and a write zero operation 603, another interstitial restore pulse 620 may be asserted.

With continuing reference to FIG. 6 and renewed reference to FIG. 1A, the timing examples of FIG. 6 are further described. For a write zero operation 603 following read one operation 602, WL1 voltage 611 is brought to a logic high level, as generally indicated by pulse 623. Additionally, while pulse 623 is asserted, WL2 voltage 612 is brought to a logic high level, as generally indicated by pulse 632. Furthermore, for a write zero operation 603, bitline voltage 610 is brought to a logic high level as generally indicated by pulse 634. Thus, storage element 102 is coupled to bitline voltage 610 via access transistor 108 being in a conductive state. Moreover, storage element 102 is pulled high by bitline voltage 610. Accordingly, storage element 102 is put into a substantially non-current-conductive state, namely a current blocking state. Subsequent to pulse 623 and prior to a subsequent read zero operation 604, an interstitial restore pulse 620 may be asserted. For a read zero operation 604, WL2 voltage 612 is in a logic low state, and WL1 voltage 611 is brought to a logic high level as generally indicated by pulse 624. As indicated by bitline voltage 610 for a read zero operation 604, a logic 0 voltage level is read, since the thyristor-based storage element 102 is in the non-current-conductive state which results in providing no current to pull up bitline voltage 610. After assertion of pulse 624 and prior to another read or write operation of memory cell 101, another interstitial restore pulse 620 may be asserted. Notably, restore pulses 620 do not need to be asserted after each write or after each read operation, as illustratively shown in this example. However, this example does clearly indicate that restore pulses may be included within read/write cycling of a memory cell 101 for successive write and read operations involving the same WL1 111. Accordingly, it should be appreciated that restore pulsing may be done without having to resort to halting a write operation, halting a read operation, or any combination thereof. Moreover, it should be appreciated that interstitial restore pulses 620 may be inserted between successive write operations or successive read operations, though read-after-write operations are illustratively shown in FIG. 6.

Figure 7:
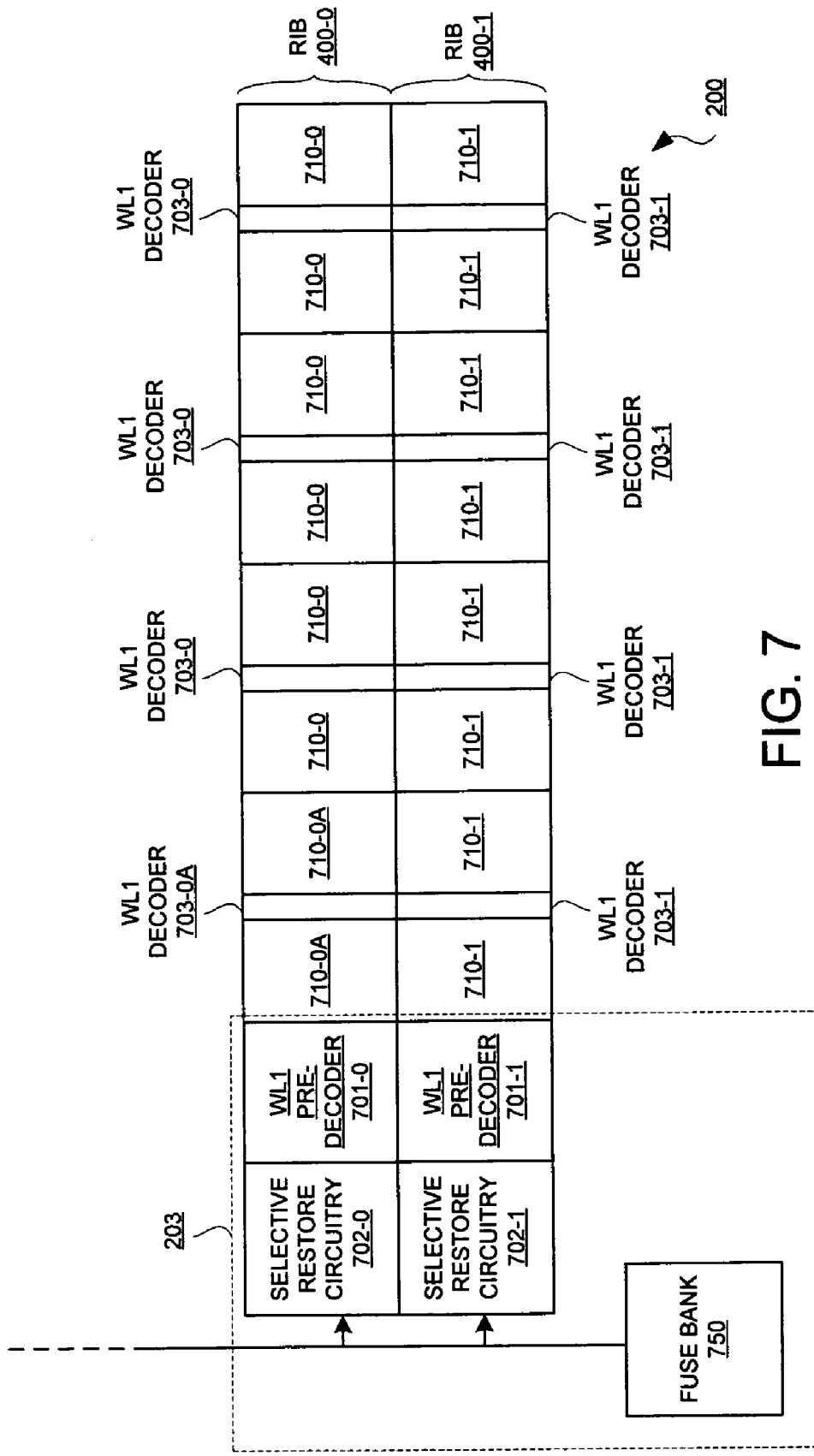
FIG. 7 is a high-level block diagram depicting an exemplary embodiment of a thyristor-based memory of FIG. 2 having selective restore circuitry.

FIG. 7 is a high-level block diagram depicting an exemplary embodiment of memory 200 having selective restore circuitry 203. In this example, rib 400-0 ("rib 0") and rib 400-1 ("rib 1") are illustratively shown. However, it should be appreciated that fewer or more ribs may be implemented. For clarity way of example and not limitation, a fuse bank 750 may be coupled to ribs, including ribs 0 and 1. Fuse bank 750 may be used to store address locations to identify locations to be selectively restored. Moreover, as described elsewhere herein other circuit elements, other than fuses, may be used. Notably, fuse bank 750 may be partitioned such that portions thereof are respectively associated with ribs.

For each rib 0 and 1, there are respective selective restore circuits 702-0 and 702-1 associated therewith. For example, rib 0 has associated therewith selective restore circuit 702-0 of restore circuitry 203, and rib 1 associated therewith selective restore circuit 702-1 of restore circuitry 203. Associated with each rib 0 and 1 is a WL1 predecoder. Thus, for example, rib 0 has associated therewith WL1 predecoder 700-0, and rib 1 has associated therewith WL1 predecoder 701-1. WL1 predecoders are configured to decode an address associated with a grouping of WL1s to select a WL1 decoder, such as WL1 decoder 703-1 of rib 1 of FIG. 7. The decoder select signal provided from WL1 predecoder 701-1 for example, thus may be used to select WL1 decoder 703-1, and the WL1 decoder select signal received and decoded by WL1 decoder 703-1 to access an associated WL1 of the WL1s accessible by WL1 decoder 703-1. Rib 0 includes MATs 710-0, and rib 1 includes MATs 710-1. Each pair of MATs forms a MAT2, namely a pair of MATs, and between each pair of MATs is a WL1 decoder. For example, a MAT2 formed of associated MATs 710-0A has located between such MATs WL1 decoder 703-0A. Notably, only eight MATs are illustratively shown for purposes of clarity, though fewer or more MATs may be implemented.

Figure 8:
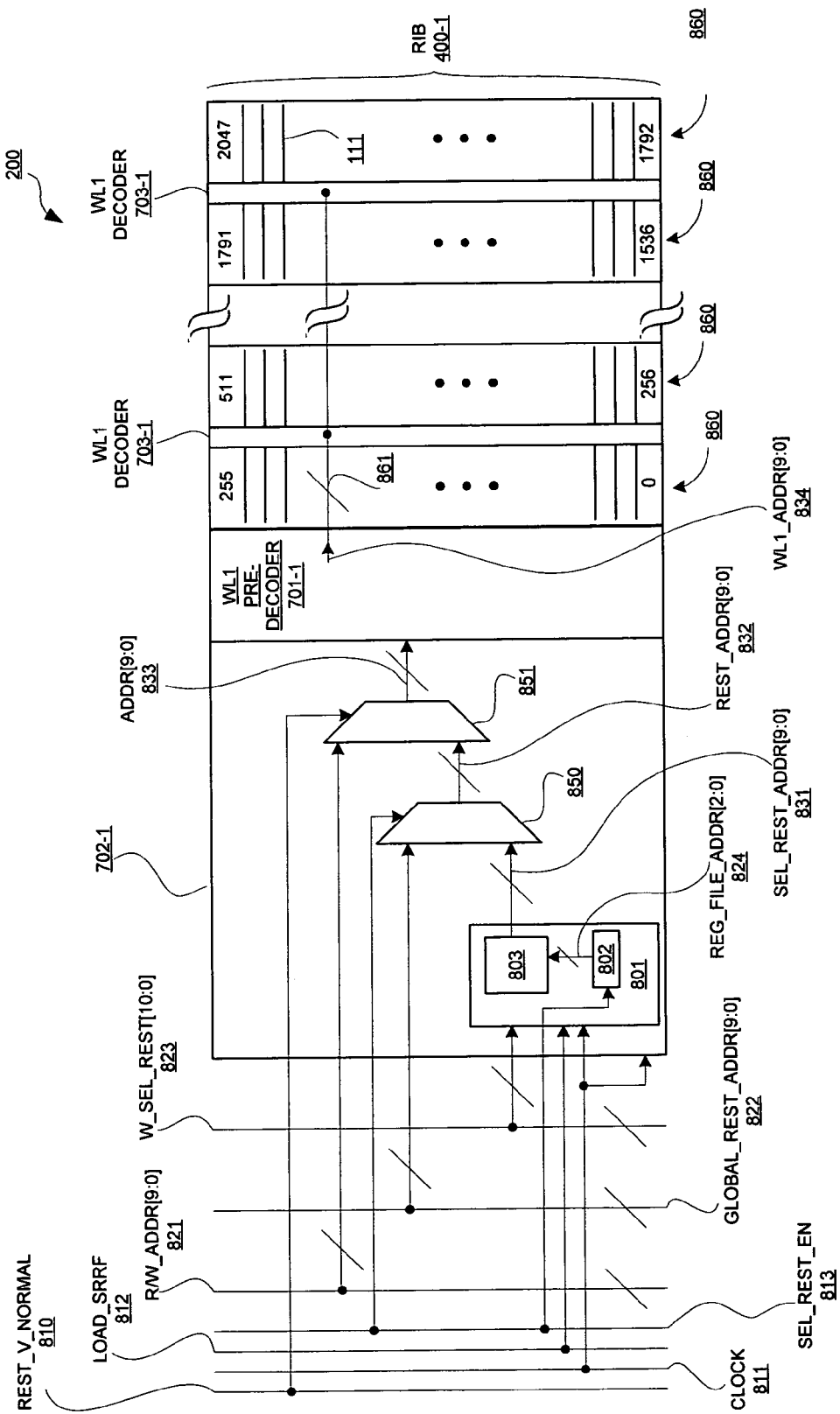
FIG. 8 is a schematic/block diagram depicting an exemplary embodiment of a thyristor-based memory having selective restore circuitry.

FIG. 8 is a schematic/block diagram depicting an exemplary embodiment of memory 200 having selective restore circuit 702-1 for rib 1. Selective restore circuit 702-1 includes multiplexers 850 and 851, as well as selective restore register file block 801. Selective restore register file block 801 includes selective restore register file address generator 802. Address generator 802 may be implemented as a counter, and is referred to hereinafter as counter 802. Output of counter 802 is register file address signal 824. In this exemplary embodiment, register file address signal 824 is depicted as a 3-bit signal, though other bit widths may be used as will become apparent. This bit width is a count, such as anywhere from 0 to 7, which corresponds to 0 to 7 registered addresses. Notably, though the example of a maximum of eight addresses may be registered for a rib in a bank of registers 803 of selective restore register file block 801, this number may be fewer or more than 8 depending on implementation. None, some or all of registers 803 may be used depending on the number of locations in a rib that are to be restored more frequently.

These registers 803 may be initialized with addresses from fuse bank 750 of FIG. 7. For this initialization, provided to selective restore register file block 801 is load selective restore register files signal ("load SRRF") 812, hereinafter referred to as load signal 812. Load signal 812 is used to load into register bank 803 addresses associated with identified WL1s having one or more memory cells 101 that need to be restored more frequently. Thus, at least one selective restore address signal 831 may be written to registers 803 responsive to write selective restore signal ("W_SEL_REST[10:0]") 823 provided to selective restore register file block 801. In the following description, it shall be assumed that this initialization of writing addresses to registers 803 has been done.

In a non-restore operation for a rib, a read/write address signal 821, which is this exemplary embodiment is a 10-bit wide signal, is provided as data input to multiplexer 851.

Responsive to restore versus normal signal 810, which is provided to multiplexer 851 as a control select input, a normal, i.e. non-restore operation, such as a read or a write of a memory cell, may take place. Thus, output of multiplexer 851, which is address signal 833, is a WL1 address for WL1 predecoder 701-1 for such a read or write operation. In this example, address signal 833 is a 10-bit wide signal. Selective restore enable signal 813 is provided to multiplexer 850 and selective restore register file block 801.

For a global restore operation for a rib, selective restore enable signal 813 is disabled as a control select input to multiplexer 850. For those memory cells associated with restore operations 502, select restore enable signal 813 is used to select global restore address signal 822 for output 832 from multiplexer 850. Global restore address signal 822, which is provided as input to multiplexer 850, is in this example a 10-bit wide signal. Output of multiplexer 850, which is a restore address signal 832, is provided as input to multiplexer 851 as a 10-bit wide signal in this example. For either a global or selective restore operation, restore versus normal signal 810 provided as a control select to multiplexer 851 selects output of multiplexer 850 for output as address signal 833 from multiplexer 851.

Predecoded address signal 833 is provided to WL1 predecoder 701-1, which decodes address signal 833 to provide a WL1 address 834, which in this exemplary embodiment is a 10-bit wide signal. In this example, rib 1 is shown having WL1s 111 ranging from 0 to 2047. In this example, there are 256 WL1s 111 within each column 860. Notably, WL1 address signal 834 is provided to columns 860 via predecoder lines 861, which are coupled to WL1 decoders 703-1.

For a restore mode which is not a global restore mode but rather is a selective restore mode, selective restore enable signal 813 is used to select output from register bank 803, namely selective restore address signal 831, as output of multiplexer 850. Register file address signal 824 is provided to a bank of registers 803. Again, in this example, register bank 803 is eight deep for storing up to eight selective restore addresses, though fewer or more addresses may be stored. In this example, write selective restore signal 823 is an 11-bit wide signal, where an extra bit is used for disabling a restore operation if that restore address register is not being used. In other words, not all registers in register bank 803 need be used. Accordingly, no registers in a register bank 803 need be used if there are no locations in a rib to be selectively restored. Thus, such a rib would have no selective restore operation performed on it.

Register file address signal 824 in a selective restore mode provides N register file addresses to register bank 803. In this example N is equal to 8. For example, counter 802 counts from 0 to 7. A clock signal 811 is provided to selective restore circuit 702-1, and in particular to selective restore register file block 801. Thus, counter 802 is clocked responsive to clock 811. A selective restore enable signal 813 is provided to restore register file block 801, and used as a count enable signal to cause counter 802 to count through N clock cycles during a selective restore mode, such as restore cycles 501 of FIG. 5, and not to count clock cycles during a global restore mode, such as restore cycles 502 of FIG. 5. A count value output from counter 802 is provided to register bank 803 as register file address signal 824, to subsequently output from 0 to 7.

Output of register bank 803, in response to register file address signaling 824, successively provides each selective restore address signal 831 registered, which in this exemplary embodiment is a 10-bit wide signal. Selective restore address signal 831 indicates a WL1 address within rib 1. Output of register bank 803 is output from multiplexer 850 responsive to selective restore enable signal 813. Output from multiplexer 850 is selected for output from multiplexer 851 responsive to restore versus normal signal 810 being for a selective restore mode, where normal indicates a global restore mode. Again, both global and selective restore modes may overlap with read or write modes, and combinations thereof.

As the remainder of the description for such a select restore mode is the same as a previously described for global restore mode, it is not repeated here. However, it should be appreciated that a global restore mode is not active during a selective restore mode, and vice-versa, responsive to selective restore enable signal 813. Furthermore, it should be appreciated that because, as previously described, restore pulses can be interlineated between read pulses, write pulses, or a combination thereof, read or write operations may occur during both selective restore and global restore modes.

Notably, in the example of FIG. 8, the number of rows and columns is merely an example, and other array configurations may be used. Accordingly, other bit widths as mentioned above may be employed in accordance with the dimensions of the array, and the number of addresses that may be registered.

Figure 9:
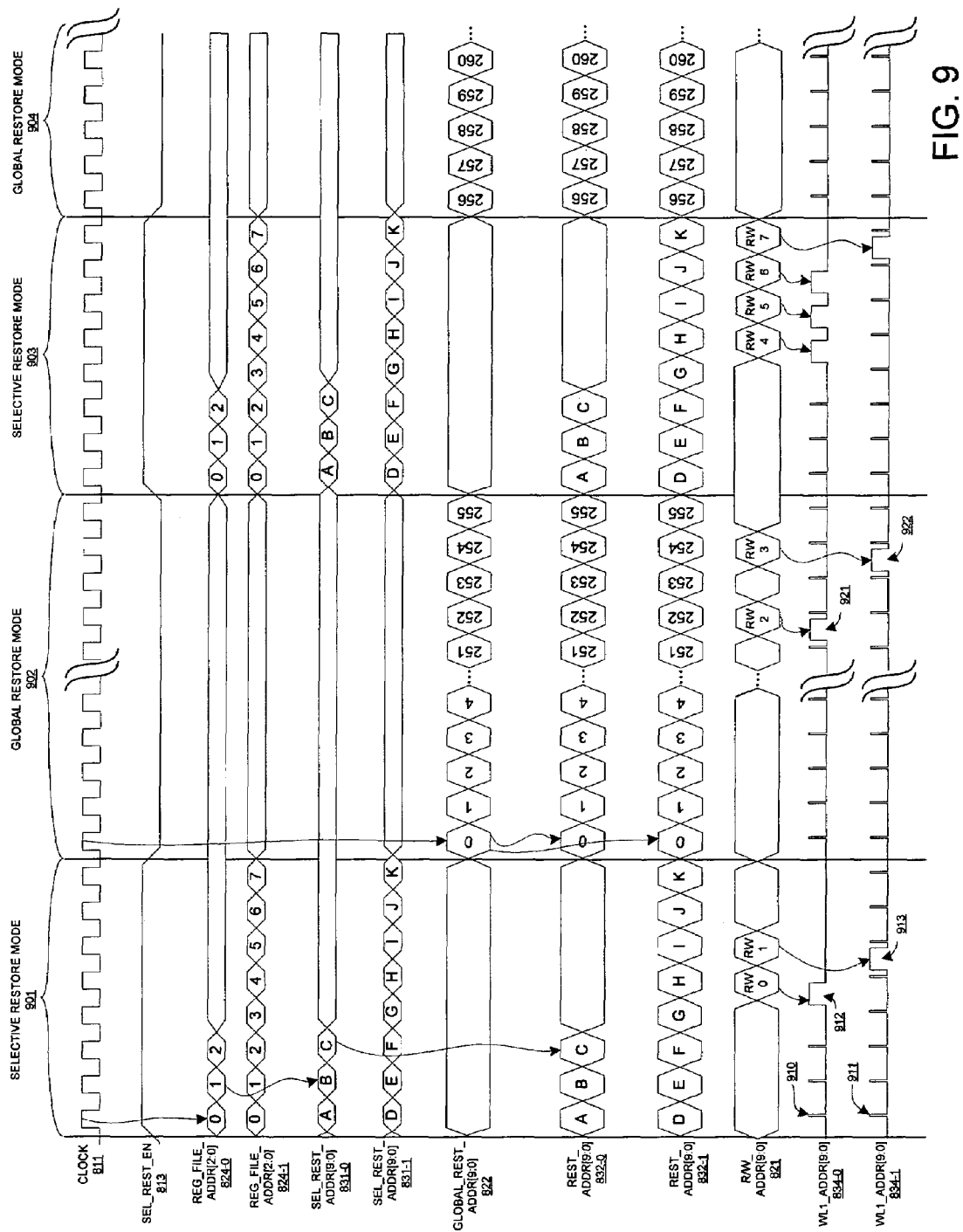
FIG. 9 is a timing diagram depicting an exemplary embodiment of operation of a thyristor-based memory for selective restore modes and global restore modes.

FIG. 9 is a timing diagram depicting an exemplary embodiment of operation of memory 200 of FIG. 2 for selective restore modes 901 and 903, and global restore mode 902 and a portion of global restore mode 904. Clock signal 811 in this example cycles eight times for each selective restore mode 901 and 903 and cycles 256 times for each global restore mode, such as global restore mode 902. Selective restore enable signal 813 is active high during each selective restore mode 901 and 903, for selecting output from multiplexer 850 of FIG. 8 as previously described. During selective restore mode 901, for example, global restore address signal 822 is a "don't care" because it is not selected for output by multiplexer 850 of FIG. 8. Selective restore enable signal 813 is inactive low during global restore modes, including global restore mode 902, as previously described with respect to output from multiplexer 850 of FIG. 8.

Notably, it should be understood that the same global restore address signal 822 may be used for one or more ribs at a time, and generally two or more ribs are restored at the same time for both global and selective restore modes. For the example of FIG. 9, it shall be assumed that more than one rib, such as ribs 0 and 1, is being globally and selectively restored at the same time as indicated by a −0 or −1 respectively as part of the signal reference number, where signals 811, 813, and 822 are applied to both of ribs 0 and 1. The remainder FIG. 9 is described with additional reference to FIGS. 2, 7 and 8.

Register file address signal 824-0 in this example outputs counts 0, 1, and 2, such that register bank 803 of rib 0 will output via selective restore address signal 831 three registered file addresses A, B, and C, respectively. Notably, if register bank 803 is not full of addresses, as in this example for rib 0, then some number less than eight addresses, namely these three registered file addresses A, B, and C in this example, are selective restore addresses. A disable bit is set for register file locations 3 through 7 in this example. Register file address signal 824-1 in this example counts from 0 to 7, such that register bank 803 of rib 1 will output via selective restore address signal 831 all eight available registered file addresses D, E, F, G, H, I, J, and K, respectively. There is a one-to-one correspondence for both selective and global restore modes, as applicable depending on which of such modes is active, from signals 824-0 and 824-1 to signals 831-0 and 831-1, respectively, and then from signals 831-0 and 831-1 to 832-0 and 832-1, respectively.

Each restore pulse is associated with pulsing a particular selective restore address, such as pulse 910 on WL1 address signal 834-0 for address A of selective restore address signal 831-0 and restore address signal 832-0, and such as pulse 911 on WL1 address signal 834-1 for address D of selective restore address signal 831-1 and restore address signal 832-1. Thus, for example during selective restore mode 901, restore address signal 832-0 and restore address signal 832-1 are respectively provided responsive to selective restore address signals 831-0 and 831-1. However, as register file locations 3 through 7 are disabled in this example for rib 0 as indicated by selective restore address signal 831-0, there are no associated restore pulses on WL1 address signal 834-0 for those register file locations 3 through 7.

During a selective restore mode 901, a read/write address signal 821 may be asserted. For example, read/write addresses ("RW") 0 and RW 1 of R/W address signal 821 may result in respective pulses 912 and 913 respectively on WL1 address signal 834-0 and 834-1. Accordingly, a read or a write operation may take place during selective restore mode 901, and such read or write pulses may be located between restore pulses as illustratively shown in FIG. 9.

For global restore mode 902, selective restore enable signal 813 is de-asserted by bringing it to a logic low level in this example, and global restore address signals 822 are used as the inputs to address 832 during global restore mode 902. As a reminder, the term signal is used herein to refer to individual signals and a plurality of signals, such as a "bus of signals." In this example, 256 cycles of clock signal 811 transpire during global restore mode 902. During global restore mode 902, signals 824-0, 824-1, 831-0, and 831-1 are not used.

A counter of periphery circuitry 201 of FIG. 2 is used to count for each cycle of clock signal 811 during global restore mode 902 to incrementally restore wordlines. For example, during global restore mode 902 wordlines 0 through 255 of a column 860 are pulsed with restore pulses 901 on WL1 address signals 834-0 and 834-1 responsive to a count. Notably, during global restore mode 902, restore address signals 832-0 and 832-1 are equivalent to global restore address signal 822. For each address of restore address signals 832-0 and 832-1 there is a respectively corresponding restore pulse respectively on WL1 address signals 834-0 and 834-1. Furthermore, for example, operations RW 2 and RW 3 of R/W address signal 821, may be used to provide respective read or write pulses 921 and 922 respectively on WL1 address signals 834-0 and 834-1. Such read or write pulses may be between restore pulses as illustratively shown in FIG. 9.

After global restore mode 902, another selective restore mode 903 takes place using the previously described signaling; notably, the same address or addresses provided from selective restore register file block 801 are repeatedly used for selective restore mode 901. However, on a next global restore mode, such as shown in part in respect to global restore mode 904, global restore address signal 822, as well as restore address signals 832-0 and 832-1, continue counting from where they left off on a prior global restore mode, namely global restore mode 902. In the example of FIG. 8, global restore address signal 822 would count from 0 to 2047 to count 2048 WL1s, or 2048 WL1 addresses, before rolling over and beginning again at 0. Thus, for this example of 2048 WL1s to be pulsed in 256 cycle increments, it will take 8 global restore mode modes to pulse each of the memory cells associated with WL1s 111 of rib 1 of FIG. 8 at least one time. However, other WL1s 111, as indicated with respect to selective restore address signals 831-0 and 831-1, will be pulsed more frequently, namely 8 times more often in this example.

Notably, for a thyristor-based memory cell, it is possible to do a read and a restore at the same time. However, write operations preclude doing a restore during a write, and thus for reliability reasons, restore pulses are interleaved between read/write pulsing or vice versa.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. An integrated circuit having memory, comprising:
a memory array including an array of memory cells; and
state maintenance circuitry coupled to the array of memory cells, the state maintenance circuitry configured to select between a first restore address and a second restore address, the first restore address being associated with a first line in the array of memory cells, the second restore address being associated with a second line in the array of memory cells, the first line having first memory cells coupled thereto, the second line having second memory cells coupled thereto, the first memory cells capable of passing a threshold retention time with a first frequency of restore cycling, the second memory cells capable of passing the threshold retention time with a second frequency of restore cycling, the second frequency of restore cycling being greater than the first frequency of restore cycling.

2. The integrated circuit according to claim 1, wherein the state maintenance circuitry is configured to provide the first frequency of restore cycling to the second memory cells in the array of memory cells, and wherein the state maintenance circuitry is configured to provide the second frequency of restore cycling to each of the second memory cells in the array of memory cells.

3. The integrated circuit according to claim 2, wherein the state maintenance circuitry is configured to provide the first frequency of restore cycling to each memory cell in the array of memory cells.

4. The integrated circuit according to claim 2, wherein the first restore address is a global restore address, and wherein the second restore address is a selective restore address.

5. The integrated circuit according to claim 4, wherein the global restore address and the selective restore address are for providing restore pulses to each of the first memory cells and the second memory cells respectively responsive to the first frequency of restore cycling and the second frequency of restore cycling.

6. The integrated circuit according to claim 5, wherein the first memory cells and the second memory cells are thyristor-based memory cells.

7. The integrated circuit according to claim 6, wherein the first line and the second line are respective access wordlines for respectively accessing the first memory cells and the second memory cells.

8. The integrated circuit according to claim 7, wherein the access wordlines are associated with transistor gates, wherein the thyristor-based memory cells include access transistors respectively coupled to thyristor-based storage elements, wherein each of the transistor gates is respectively associated with an access transistor of the access transistors.

9. The integrated circuit according to claim 4, wherein the state maintenance circuitry includes first multiplexing circuitry configured to select an output between the global restore address and the selective restore address.

10. The integrated circuit according to claim 9, wherein the state maintenance circuitry includes second multiplexing circuitry configured to select between the output of the first multiplexing circuitry and a read/write address.

11. The integrated circuit according to claim 10, wherein the state maintenance circuitry includes a predecoder coupled to receive the output of the first multiplexing circuitry, the predecoder configured to predecode the output of the first multiplexing circuitry to provide a decoder select signal, the decoder select signal for selecting a wordline decoder among wordline decoders in the memory array.

12. The integrated circuit according to claim 11, wherein the wordline decoder is configured to select a wordline among wordlines of a portion of the array of memory cells, the wordlines including the first line and the second line.

13. The integrated circuit according to claim 12, wherein the state maintenance circuitry includes a selective restore register file block, the selective restore register file block including a counter coupled to a bank of registers, the bank of registers configured to store a plurality of selective restore addresses including the selective restore address.

14. The integrated circuit according to claim 13, wherein the plurality of selective restore addresses are provided responsive to a count of the counter, the counter configured to count responsive to a clock signal and responsive to a selective restore mode being active.

15. A method for maintaining state of stored data, comprising:
providing a clock signal;
selectively activating a selective restore mode;
providing at least one selective restore address for the selective restore mode;
selecting the at least one selective restore address as a first wordline restore address for a first wordline in an array of memory cells;
applying a restore pulse to each memory cell associated with the first wordline responsive to the clock signal; and
selectively deactivating the selective restore mode for a global restore mode.

16. The method according to claim 15, further comprising:
providing at least one global restore address for the global restore mode;
selecting the at least one global restore address as a second wordline restore address for a second wordline in the array of memory cells;
applying a restore pulse to each memory cell associated with the second wordline responsive to the clock signal; and
selectively reactivating the selective restore mode.

17. The method according to claim 16, wherein the selective restore mode and the global restore mode have respectively associated therewith a first number of clock cycles and a second number of clock cycles of the clock signal, the first number of clock cycles being less than the second number of clock cycles.

18. The method according to claim 17, wherein the at least one selective restore address is provided responsive to a first count and the at least one global restore address is provided responsive to a second count, wherein the first count is less than or equal to the first number of clock cycles and the second count is equal to the second number of clock cycles.

19. The method according to claim 17, further comprising providing a read/write address during the selective restore mode and the global restore mode, the read/write address including at least one read/write pulse, the restore pulse respectively applied to each said memory cell of the first wordline and the second wordline respectively for the selective restore mode and the global restore mode is done during a continuous read/write operation such that the at least one read/write pulse is located between two restore pulses.

20. The method according to claim 19, wherein the array of memory cells is an array of thyristor-based memory cells.

21. An integrated circuit having memory, comprising:
a memory array including an array of memory cells; and
state maintenance circuitry coupled to the array of memory cells, the state maintenance circuitry configured to select between a selective address and a global address, the selective address being associated with at least one memory cell in the array of memory cells to be pulsed greater than a threshold amount, the global address being associated with at least one other memory cell in the array of memory cells to be pulsed the threshold amount, the at least one memory cell and the at least one other memory cell configured such that data state respectively thereof is maintained by application of a state maintenance pulse to at least one access wordline associated with the at least one memory cell and the at least one access wordline or another at least one access wordline associated with the at least one other memory cell.

22. The integrated circuit, according to claim 21, wherein the data state is a logic 1.

23. The integrated circuit, according to claim 21, wherein the data state is associated with a substantially current conducting state of the at least one memory cell and the at least one other memory cell.

24. The integrated circuit, according to claim 21, wherein the data state is a logic 0.

25. The integrated circuit, according to claim 21, wherein the data state is associated with a substantially current blocking state of the at least one memory cell and the at least one other memory cell.

26. The integrated circuit, according to claim 21, wherein the data state is associated with a substantially current blocking state of the at least one memory cell, and wherein the data state is associated with a substantially current conducting state of the at least one other memory cell.

27. The integrated circuit, according to claim 21, wherein the data state is associated with a substantially current blocking state of the at least one other memory cell, and wherein the data state is associated with a substantially current conducting state of the at least one memory cell.

28. The integrated circuit, according to claim 21, wherein the state maintenance circuitry is configured to provide corresponding state maintenance pulses to a subset of access wordlines of the memory array, the subset of access wordlines associated with memory cells to be pulsed greater than the threshold amount.

29. The integrated circuit, according to claim 28, wherein the state maintenance circuitry is configured to provide corresponding state maintenance pulses to all of the access wordlines of the memory array in associated columnar increments thereof.

* * * * *